US010347722B2

(12) United States Patent
Tansu et al.

(10) Patent No.: US 10,347,722 B2
(45) Date of Patent: Jul. 9, 2019

(54) ARTIFICIALLY ENGINEERED III-NITRIDE DIGITAL ALLOY

(71) Applicant: LEHIGH UNIVERSITY, Bethlehem, PA (US)

(72) Inventors: Nelson Tansu, Bethlehem, PA (US); Wei Sun, Bethlehem, PA (US); Chee-Keong Tan, Bethlehem, PA (US)

(73) Assignee: LEHIGH UNIVERSITY, Bethlehem, PA (US)

( * ) Notice: Subject to any disclaimer, the term of this patent is extended or adjusted under 35 U.S.C. 154(b) by 0 days.

(21) Appl. No.: 15/061,156

(22) Filed: Mar. 4, 2016

(65) Prior Publication Data

US 2016/0260804 A1    Sep. 8, 2016

Related U.S. Application Data

(60) Provisional application No. 62/128,112, filed on Mar. 4, 2015.

(51) Int. Cl.
*H01L 29/15* (2006.01)
*H01L 21/02* (2006.01)
*H01L 29/20* (2006.01)
*H01L 29/205* (2006.01)

(52) U.S. Cl.
CPC ........ *H01L 29/155* (2013.01); *H01L 21/0254* (2013.01); *H01L 21/02458* (2013.01); *H01L 21/02507* (2013.01); *H01L 29/2003* (2013.01); *H01L 29/205* (2013.01)

(58) Field of Classification Search
CPC ......... H01L 21/02458; H01L 21/02507; H01L 21/0254; H01L 29/155; H01L 29/2003; H01L 29/205
See application file for complete search history.

(56) References Cited

U.S. PATENT DOCUMENTS

| | | | |
|---|---|---|---|
| 6,455,337 B1 * | 9/2002 | Sverdlov | B82Y 20/00 438/22 |
| 9,129,961 B2 * | 9/2015 | Ahn | C23C 16/40 |
| 9,202,905 B1 * | 12/2015 | Xie | H01L 29/7783 |
| 2008/0213663 A1 * | 9/2008 | Hu | B82Y 10/00 429/219 |
| 2010/0068843 A1 * | 3/2010 | Song | H01S 5/183 438/46 |
| 2010/0221512 A1 * | 9/2010 | Lee | H01L 21/02395 428/213 |
| 2012/0074424 A1 * | 3/2012 | Lee | H01L 21/2007 257/76 |
| 2013/0334666 A1 * | 12/2013 | Nepal | H01L 21/0254 257/615 |
| 2014/0042579 A1 * | 2/2014 | Chang | B29D 11/00365 257/432 |

(Continued)

OTHER PUBLICATIONS

Akasaka, Tetsuya et al., "Extremely Narrow Violet Photoluminescence Line from Ultrathin InN Single Quantum Well on Step-Free GaN Surface," Advanced Materials, 2012, vol. 24, pp. 4296-4300.

(Continued)

*Primary Examiner* — Abul Kalam
(74) *Attorney, Agent, or Firm* — FisherBroyles, LLP

(57) ABSTRACT

A material structure and system for generating a III-Nitride digital alloy.

21 Claims, 12 Drawing Sheets

(56) References Cited

U.S. PATENT DOCUMENTS

2015/0140789 A1* 5/2015 Nepal ............... H01L 21/0254
438/478

OTHER PUBLICATIONS

Ambacher, O. et al., "Pyroelectric properties of Al(In)GaN hetero- and quantum well structures," Journal of Physics: Condensed Matter, vol. 14, 2002, pp. 3399-3434.

Arif, Ronald A. et al., "Polarization engineering via staggered InGaN quantum wells for radiative efficiency enhancement of light emitting diodes," Applied Physics Letters, vol. 91, 2007, pp. 091110-1 to 091110-3.

Arif, Ronald A. et al., "Spontaneous Emission and Characteristics of Staggered InGaN Quantum-Well Light-Emitting Diodes," IEEE Journal of Quantum Electronics, vol. 44, No. 6, Jun. 2008, pp. 573-580.

Arif, Ronald A. et al., "Type-II InGaN—GaNAs quantum wells for laser applications," Applied Physics Letters, vol. 92, 2008, pp. 011104-1 to 011104-3.

Bank, Seth R. et al., "Recent Progress on 1.55-um Dilute-Nitride Lasers," IEEE Journal of Quantum Electronics, vol. 43, No. 9, Sep. 2007, pp. 773-785.

Bernardini, F. and Fiorentini, V., "Spontaneous versus Piezoelectric Polarization in III-V Nitrides: Conceptial Aspects and Practical Consequences," Phys. Stat. Sol. (b), vol. 216, 1999, pp. 391-398.

Bhuiyan, Ashraful Ghani et al,. "InGaN Solar Cells: Present State of the Art and Important Challenges," IEEE Journal of Photovoltaics, vol. 2, No. 3, Jul. 2012, pp. 276-293.

Blokhin, Sergey A. et al., "Vertical-Cavity Surface-Emitting Lasers Based on Submonolayer InGaAs Quantum Dots," IEEE Journal of Quantum Electronics, vol. 42, No. 9, Sep. 2006, pp. 851-858.

Cai, Xiao-mei et al., "Fabrication and characterization of InGaN p-i-n homojunction solar cell," Applied Physics Letters, vol. 95, 2009, pp. 173504-1 to 173504-3.

Chen, X. et al., "Growth, fabrication, and characterization of InGaN solar cells," Phys. Stat. Sol. (a) vol. 205, No. 5, 2008, pp. 1103-1105.

Choi, Suk et a., "Efficiency droop due to electron spill-over and limited hole injection in III-nitride visible light-emitting diodes employing lattice-matched InAlN electron blocking layers," Applied Physics Letters, vol. 101, 2012, pp. 161110-1 to 161110-5.

Chuang Shun Lien, "Optical Gain of Strained Wurtzite GaN Quantum-Well Lasers," IEEE Journal of Quantum Electronics, vol. 32, No. 10, Oct. 1996, pp. 1791-1800.

Cody, Jeffrey G. et al., "Application of the digital alloy composition grading technique to strained InGaAs/GaAs/AlGaAs diode laser active regions," J. Vac. Sci. Technol. B, vol. 12, No. 2, 1994, pp. 1075-1077.

Crawford, Mary H., "LEDs for Solid-State Lighting: Performance Challenges and Recent Advances," IEEE Journal of Selected Topics in Quantum Electronics, vol. 15, No. 4, 2009, pp. 1028-1040.

Cui, X. Y. et al., "Band gap engineering of wurtzite and zinc-blende GaN/AlN superlattices from first principles," Journal of Applied Physics, vol. 108, 2010, pp. 103701-1 to 103701-10.

Dahal, R. et al., "InGaN/GaN multiple quantum well solar cells with long operating wavelengths," Applied Physics Letters, vol. 94, 2009, pp. 063505-1 to 063505-3.

Dahal, R. et al., "InGaN/GaN multiple well concentrator solar cells," Applied Physics Letters, vol. 97, 2010, pp. 073115-1 to 073115-3.

Ee, Yik-Khoon et al., "Abbreviated MOVPE nucleation of III-nitride light-emitting diodes on nano-patterned sapphire," Journal of Crystal Growth, vol. 312, 2010, pp. 1311-1315.

Ee, Yik-Khoon et al., "Metalorganic Vapor Phase Epitaxy of III-Nitride Light-Emitting Diodes on Nanopatterned AGOG Sapphire Substrate by Abbreviated Growth Mode," IEEE Journal of Selected Topics in Quantum Electronics, vol. 15, No. 4, 2009, pp. 1066-1072.

Ee, Yik-Khoon, "Enhancement of light extraction efficiency of InGaN quantum wells light emitting diodes using SiO2/polystyrene microlens arrays," Applied Physics Letters, vol. 91, 2007, pp. 221107-1 to 221107-3.

Ee, Yik-Khoon, "Optimization of Light Extraction Efficiency of III-Nitride LEDs with Self-Assembled Colloidal-Based Microlenses," IEEE Journal of Selected Topics in Quantum Electronics, vol. 15, No. 4, 2009, pp. 1218-1225.

Farrell, R. M. et al., "Materials and growth issues for high-performance nonpolar and semipolar light-emitting devices," Semiconductor Science and Technology, vol. 27, 2012, pp. 1-14.

Ferguson, James W. et al,. "Optical Gain in GaInNAs and GaInNAsSb Quantum Wells," IEEE Journal of Quantum Electronics, vol. 47, No. 6, Jun. 2011, pp. 870-877.

Gorczyca, I. and Suski T., "Band Structure and Quantum Confined Stark Effect in InN/GaN superlattices," Crystal Growth and Design, vol. 12, 2012, pp. 3521-3525.

Gorczyca, I. et al., "Band gaps in InN/GaN superlattices: Nonpolar and polar growth directions," Journal of Applied Physics, vol. 114, 2013, pp. 223102-1 to 223102-7.

Gorczyca, I. et al., "Band gaps in internal electric fields in semipolar short period in InN/GaN superlattices," Applied Physics Letters, 104, 2014, pp. 232101-1 to 232101-4.

Gorczyca, I. et al., "Hydrostatic pressure and strain effects in short period InN/GaN superlattices," Applied Physics Letters, vol. 101, 2012, pp. 092104-1 to 092104-5.

Hong, Y.G.et al., "Growth of GaInNAs quaternaries using a digital alloy technique," J. Vac. Sci Technol. B, vol. 20, No. 3, 2002, pp. 1163-1166.

Jamil, Muhammad et al, "Influence of growth temperature and V/III ratio on the optical characteristics of narrow band gap (0.77 eV) InN grown on GaN/sapphire using pulsef MOVPE," Journal fo Crystal Growth 310, 2008, pp. 4947-4953.

Jamil, Muhammad et al, "MOVPE and photoluminescence of narrow band gap (0.77 eV) InN on GaN/sapphire by pulsef growth mode," Phys. Stat. Sol. (a) vol. 205, No. 12, 2008, pp. 2886-2891.

Jani, Omkar and Ferguson, Ian, "Design and characterization of GaN/InGaN solar cells," Applied Physics Letters, vol. 91, 2007, pp. 132117-1 to 132117-3.

Krames, Michael R. et al., "Status and Future of High-Power Light-Emitting Diodes for Solid-State Lighting," Journal of Display Technology, vol. 3, No. 2, 2007, Jun. 2007, pp. 160-175.

Lang, J.R. et al., "Carrier escape mechanism dependence on barrier thickness and temperature in InGaN quantum well solar cells," Applied Physics Letters, vol. 101, 2012, pp. 181105-1 to 181105-5.

Lee, Kenneth E. And Fitzgerald, Eugene A., "Digital metamorphic alloys," Journal of Appied Physics,vol. 106, 2009, pp. 074911-1 to 074911-12.

Li, Xiao-Hang et al., "Light Extraction Efficiency and Radiation Patterns of III-Nitride Light-Emitting Diodes With Collodial Microlens Arrays With Various Aspect Ratios," IEEE Photonics Journal, vol. 3, No. 3, 2011, pp. 489-499.

Li, Xiao-Hang et al., "Light Extraction Efficiency Enhanvement of III-Nitride Light-Emitting Diodes by Using 2-D Close-Packed TiO2 Microsphere Arrays," Journal of Display Technology, vol. 9, No. 5, May 2013, pp. 324-332.

Li, Yufeng et al., "Defect-reduced green GaInN/GaN light-emitting diode on nanopatterned sapphire," Applied Physics Letters, vol. 98, 2011, pp. 151102-1 to 151102-3.

Liu, Guangyu et al., Efficiency-Droop Suppression by Using Large-Bandgap AlGaInN Thin Barrier Layers in InGaN Quantum-Well Light-Emitting Diodes, IEEE Photonics Journal, vol. 5, No. 3, 2013, pp. 1-11.

Liu, Guangyu et al., "Metalorganic vapor phase epitaxy and characterizations of nearly-lattice-matched AlInN alloys on GaN/sapphire templates and free-standing GaN substrates," Journal of Crystal Growth, vol. 340, 2012, pp. 66-73.

Mukai, Takashi, et al., "Characteristics of InGaN-Based UV/Blue/Green/Amber/Red Light-Emitting Diodes," Jpn. J. Appl. Phys. vol. 38, 1999, pp. 3976-3981.

Nakamura, Shuji et al., "Candela-class high-brightness InGaN/AlGaN double-heterostructure blue-light-emitting diodes," Appl. Phys. Lett. vol. 64, No. 13, 1994, pp. 1687-1689.

(56) References Cited

OTHER PUBLICATIONS

Nakamura, Shuji et al., "InGaN-Based Multi-Quantum-Well-Structure Laser Diodes," Jpn. J.Appl. Phys. vol. 35, 1996, pp. L74-L76.

Neufeld, Carl J. et al., "High quantum efficiency InGaN/GaN solar cells with 2.95eV band gap," Applied Physics Letters, vol. 93, 2008, pp. 143502-1 to 143502-3.

Pantha, B. N. et al., "Evolution of phase separation in In-rich InGaN alloys," Applied Physics Letters, vol. 96, 2010, pp. 232105-1 to 232105-3.

Song, Jin Dong et al., "Effects of rapid thermal annealing on the optical properties of 1.3 um InGaAlAs multiquantum wells grown by digital-alloy molecular-beam epitaxy," Applied Physics Letters, vol. 80, No. 24, 2002, pp. 4650-4652.

Tan, Chee-Keong and Tansu, Nelson, "Electrons and holes get closer," Nature Nanotechnology, vol. 10, 2015, pp. 107-109.

Taniyasu, Yoshitaka and Kasu, Makoto, "Polarization property of deep-ultraviolet light emission from C-plane AlN/GaN short-period superlattices," Applied Physics Letters, vol. 99, 2011, pp. 251112-1 to 251112-4.

Tansu, Nelson and Mawst, Luke J., "Current injection efficiency of InGaAsN quantum-well lasers," Journal of Applied Physics, vol. 97, 2005, pp. 054502-1 to 054502-18.

Tansu, Nelson and Mawst, Luke J., "High-Performance Strain-Compensated InGaAn—GaAsP—GaAs (Y=1.17um) Quantum-Well Diode Lasers," IEEE Photonics Technology Letters, vol. 13, No. 3, 2001, pp. 179-181.

Tansu, Nelson et al, "High-Performance 1200-nm InGaAs and 1300-nm InGaAsN Quantum-Well Lasers by Metalorganic Chemical Vapor Deposition," IEEE Journal of Selected Topics in Quantum Electronics, vol. 9, No. 5, 2003, pp. 1220-1227.

Tansu, Nelson et al., "Experminal evidence of carrier leakage in InGaAsN quantum-well lasers," Applied Physics Letters, vol. 83, No. 11, 2003, pp. 2112-2114.

Tansu, Nelson et al., "Extremely low threshold-current-density in InGaAs quantum-well lasers with emission wavelength of 1215-1233 nm," Applied Physics letters, vol. 82, No. 23, 2003, pp. 4038-4040.

Tansu, Nelson et al., "III-Nitride Photonics," IEEE Photonics Journal, vol. 2, No. 2, 2010, pp. 1-8.

Tansu, Nelson et al., "Low-threshold 1317-nm InGaAsN quantum-well lasers with GaAsN barriers," Applied Physics Letters, vol. 83, No. 13, 2003, pp. 2512-2514.

Tansu, Nelson et al., "Low-threshold-current-density 1300-nm dilute-nitride quantum well lasers," Applied Physics Letters, vol. 81, No. 14, 2002, pp. 2523-2525.

Tansu, Nelson et al., "Physics and characteristics of high performance 1200 nm InGaAs and 1300-1400 nm InGaAsN quantum well lasers obtained by metal-organic chemical vapour deposition," J. Phys., Condes. Matter, vol. 16, 2004, pp. S3277-S3318.

Tong, Hua et al., "Thermoelectric properties of lattice-matched AlInN alloy grown by metal organic chemical vapor deposition," Applied Physics Letters, vol. 97, 2010, pp. 112105-1-112105-3.

Tsao, Jeffrey Y. et al., "Toward Smart and Ultra-Efficient Solid-State Lighting," Advanced Optical Materials, vol. 2, 2014, pp. 809-836.

Wang, Fan et al., "Green and blue emissions in phase-separated InGaN quantum wells," Journal of Applied Physics, vol. 114, 2013, pp. 163525-1 to 163525-4.

Wu, J. et al., "Temperature dependence of the fundamental band gap of InN," Journal of Applied Physics, vol. 94, No. 7, 2003, pp. 4457-4460.

Xu, Guibao et al., "THz generation from InN films due to destructive interference between optical rectification and photocurrent surge," Semiconductor Science and Technology, vol. 25, 2010, pp. 1-5.

Xu, Lifang et al., "Carrier Recombination Dynamics Investigations of Strain-Compensated InGaAsN Quantum Wells," IEEE Photonics Journal, vol. 4, No. 6, 2012, pp. 2382-2389.

Xu, Lifang et al., "Experimental Evidence of the Impact of Nitrogen on Carrier Capture and Escape Times in InGaAsN/GaAs Single Quantum Well," IEEE Photonics Journal, vol. 4, No. 6, 2012, pp. 2262-2271.

Yamamoto, Akio et al., "Recent advances in InN-based solar cells: status and challenges in InGaN and InAlN solar cells," Phys. Status Solidi, C 7, No. 5, 2010, pp. 1309-1316.

Zhang, Jing and Tansu, Nelson, "Improvement in spontaneous emission rates for InGaN quantum wells on ternary InGaN substrate for light-emitting diodes," Journal of Applied Physics, vol. 110, 2011, pp. 113110-1 to 113110-5.

Zhang, Jing and Tansu, Nelson, "Optical Gain and Laser Characteristics of InGaN Quantum Wells on Ternary InGaN Substrates," IEEE Photonis Journal, vol. 5, No. 2, Apr. 2013, pp. 1-11.

Zhang, Jing et al,. "High-temperature characteristics of Seebeck coefficients for AlInN alloys grown by metalorganic vapor phase epitaxy," Journal of Applie Physics, vol. 110, 2011, pp. 043710-1 to 043710-6.

Zhang, Jing et al., "Characterication of Seebeck coefficients and thermoelectric figures of merit for AlInN alloys with various In-contents," Journal of Applied Physics, vol. 109, 2011, pp. 053706-1 to 053706-6.

Zhao, H.P. et al., "Design and characterics of staggered InGaN quantum-well light-emitting diodes in the green spectral regime," IET Optoelectron, vol. 3, No. 6, 2009, pp. 283-295.

Zhao, Hongping et al., "Analysis of InGaN-delta-InN quantum wells for light-emitting diodes," Applied Physics Letters, vol. 97, 2010, pp. 131114-1 to 131114-3.

Zhao, Hongping et al., "Analysis of Internal Quantum Efficiency and Current Injection Efficiency in III-Nitride and Light-Emitting Diodes," Journal of Display Technology, vol. 9, No. 4, 2013, pp. 212-225.

Zhao, Hongping et al., "Approaches for high internal quantum efficiency green InGaN light-emitting diodes with large overlap quantum wells," Optical Express, vol. 19, No. S4, 2011, pp. A991-A1007.

Zhao, Hongping et al., "Current injection efficiency induced efficiency-droop in InGaN quantum well light-emitting diodes," Solid-State Electronics, vol. 54, 2010, pp. 1119-1124.

Zhao, Hongping et al., "Growths of staggered InGaN quantum wells light-emitting diodes emitting at 520-525 nm employing graded growth-temperature profile," Applied Physics Letters, vol. 95, 2009, pp. 061104-1 to 061104-3.

Zhao, Hongping et al., "Self-consistent analysis of strain-compensated InGaN—AiGaN quantum wells for lasers and light-emitting diodes," IEEE Journal of Quantum Electronics, vol. 45, No. 1, 2009, pp. 66-78.

Zhao, Hongping et al., "Self-Consistent grain analysis of type-II 'W' InGaN—GaNAs quantum well lasers," Journal of Applied Physics, vol. 104, 2008, pp. 043104-1 to 043104-7.

Zhu, Peifen et al., "FDTD Analysis on Extraction Efficiency of GaN Light-Emitting Didoes with Microsphere Arrays," Journal of Display Technology, vol. 9, No. 5, 2013, pp. 317-323.

* cited by examiner

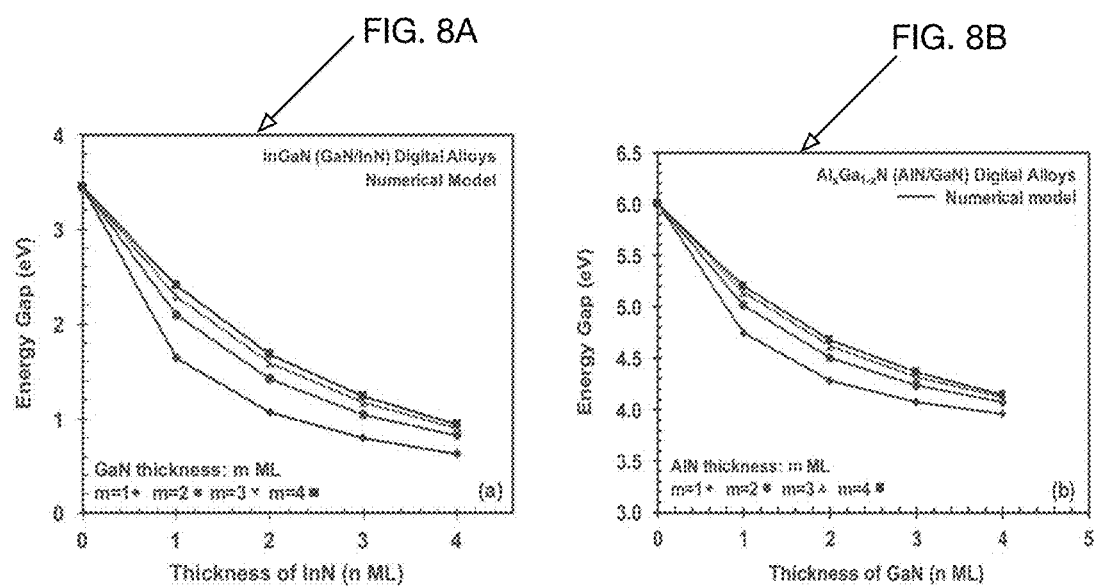

ized and implemented in advanced solid state lighting technologies in recent decades. The III-Nitride platform has also attracted tremendous efforts in developing high performance active region for optoelectronic devices including detectors and solar energy convertors. Specifically, the demand for integrating devices covering a broad spectral regime in a single nitride-based material platform drives the further pursuit of III-Nitride materials with a tunable band gap property.

ARTIFICIALLY ENGINEERED III-NITRIDE DIGITAL ALLOY

CROSS-REFERENCE TO RELATED APPLICATION

This application claims priority under 35 U.S.C. § 119(e) to U.S. Provisional Patent Application Ser. No. 62/128,112, filed Mar. 4, 2015, the entire content of which is hereby incorporated herein by reference.

STATEMENT REGARDING GOVERNMENT SUPPORT

This invention was made with government support under U.S. National Science Foundation Award Nos. ECCS-1408051 and DMR-1505122. The U.S. government has certain rights in the invention.

FIELD OF INVENTION

In general, the invention relates generally to III-Nitride materials and fabrication methods. In more detail, the invention relates to a material structure and method for generating a III-Nitride digital alloy.

BACKGROUND

III-Nitride materials have been extensively studied and implemented in advanced solid state lighting technologies in recent decades. The III-Nitride platform has also attracted tremendous efforts in developing high performance active region for optoelectronic devices including detectors and solar energy convertors. Specifically, the demand for integrating devices covering a broad spectral regime in a single nitride-based material platform drives the further pursuit of III-Nitride materials with a tunable band gap property.

The identification of the narrow bandgap in InN binary alloys (~0.64 eV) and large bandgap in AlN binary alloys (~6 eV) has enabled access to broad energy gap coverage by utilizing corresponding ternary and quaternary alloys with different Indium (In)/Gallium (Ga)/Aluminum (Al) composition. For example, varying the Indium (In) composition in InGaN ternary alloy from very low to high In-content provides the ability to cover a broad optical regime from ~3.4 eV (GaN) to ~0.64 eV (InN). Similarly, tuning the Aluminum (Al) composition in the AlGaN ternary alloy allows the transition energy to change from ~3.4 eV (GaN) to ~6 eV (AlN).

The InGaN ternary alloy with high In content has been recognized for its importance in achieving optical emission and absorption devices covering the visible spectral regime from blue to red emission, while the AlGaN ternary alloy is critical for application in deep-UV regime. However, the experimental realization of such material systems has been limited by the challenges in growing conventional ternary and quaternary alloys with high indium and aluminum composition.

In particular, the conventional epitaxy of InGaN alloy with high In composition results in a phase separated material system, which leads to detrimental issues in the electronics and optoelectronic properties of this alloy. The limitation of growing high quality InGaN alloy with high In content has been one of the major barriers in the realization of high performance optoelectronic devices employing indium rich InGaN alloys for longer wavelength applications. Therefore, new strategies are necessary to access the epitaxy of high crystalline quality III-Nitride quaternary and ternary material systems and eventually achieve the broad tunability of optoelectronic properties in the III-Nitride platform.

SUMMARY OF INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

According to one embodiment, a method of forming a III-Nitride quaternary digital alloy ("DA") of AlGaInN comprises generating a periodic structure of closely separated binary alloy layers, each of said binary alloy layers comprising one of AlN, GaN and InN, wherein each of said binary alloy layers has a respective thickness of 1-2 monolayers ("ML"s) and said periodic structure of binary alloy layers has a total thickness of between 10-50 periods.

A method of forming a III-Nitride ternary DA comprises generating a periodic structure of closely separated binary alloy layers of a first type and a second type, each of said first type of binary alloy layer comprising one of AlN, GaN and InN and each of said second type of binary alloy layer comprising one of AlN, GaN and InN, wherein the first type of binary alloy layer is different from the second type of binary alloy layer and each of said binary alloy layers has a respective thickness of 1-4 MLs and said periodic structure of binary alloy layers has a total thickness of between 10-50 periods.

A III-Nitride quaternary DA of AlGaInN comprises a periodic structure of closely separated binary alloy layers, each of said binary alloy layers comprising one of AlN, GaN and InN, wherein each of said binary alloy layers has a respective thickness of 1-2 monolayers ("ML"s) and said periodic structure of binary alloy layers has a total thickness of between 10-50 periods.

BRIEF DESCRIPTION OF DRAWINGS

FIG. 8A shows tunable energy gaps of InGaN DAs formed by M ML GaN and N ML InN ultra-thin binary-alloy layers according to one embodiment.

FIG. 8B shows tunable energy gaps of AlGaN DAs formed by M ML AlN and N ML GaN ultra-thin binary-alloy layers according to one embodiment.

DETAILED DESCRIPTION

Applicants have devised a method and system for accessing all possible ternary and quaternary III-Nitride alloys without the need for employing high In content and/or high Al content in III-Nitride structures. According to one embodiment, a set of artificially engineered nano-structures based on finite short-period superlattice structures in which different III-Nitride ultra-thin binary-alloys are utilized to overcome conventional limitations in growing high quality III-Nitride alloys. To this end, Applicants have devised a structure, herein referred to as a III-Nitride Digital Alloy ("DA") comprising a set of artificially engineered nano-structures, which are based on finite short-period superlattices formed by closely-separated binary alloy layers.

According to embodiments described herein, DAs provide an artificial engineered material structure exhibiting a large tunability in their respective optoelectronic properties. Based on the concept of DA, the phase separation issue of conventional ternary alloys is avoided naturally in this nano-structure through the alternate epitaxy of high quality binary alloys. Moreover, employing very thin GaN and InN binary layers introduces strong inter-well resonant coupling effect within the superlattice structure and therefore forms miniband structures. Taking advantage of such resonant coupling effect, miniband engineering can be performed by carefully designing the DA nano-structure and controlling the thickness of those binary thin layers during epitaxy. In this fashion, an effective "digital alloy" can be achieved with tunable optoelectronic properties comparable to that of bulk alloy. The thickness of each binary layer in the DA, represented by a monolayer (ML), determines the tunable optoelectronic properties of the resultant material. In particular, according to one embodiment, employing ultra-thin binary layers with thickness ranging from 1 to 4 MLs introduces a strong inter-well resonant coupling effect within the superlattice structure resulting in the formation of miniband structures.

DAs can be deposited by an epitaxial method employing alternate growth of ultra thin layers of high crystalline quality AlN, GaN, and InN binary alloys. By designing the combination of these binary alloys, a quaternary DA of AlGaInN and a ternary DA of AlGaN, InGaN, and AlInN can be obtained.

Figure 1:
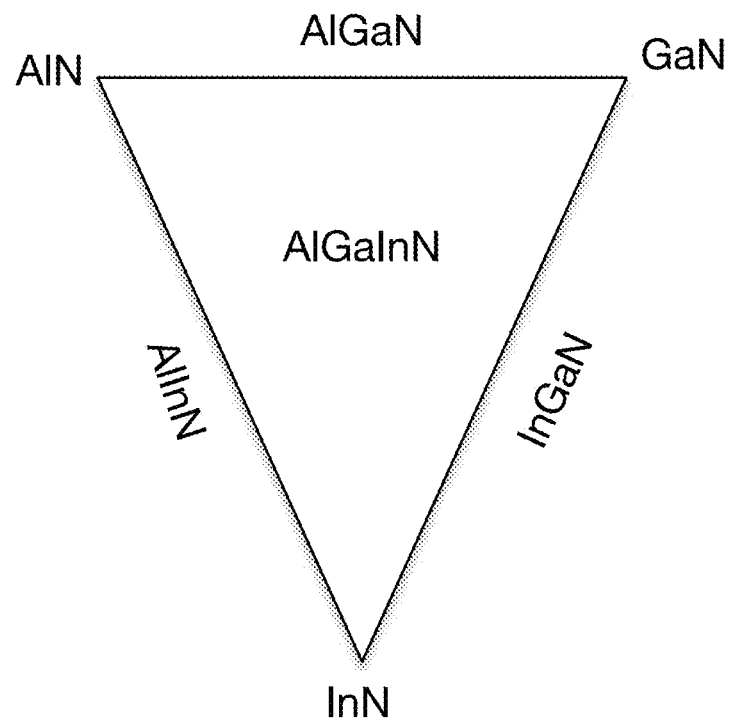
FIG. 1 is a schematic illustration showing how various ternary and quaternary DAs can be achieved according to one embodiment.

FIG. 1 is a schematic illustration showing how various ternary and quaternary DAs can be achieved according to one embodiment. In particular, the center of the triangle shown in FIG. 1 illustrates generation of a quaternary DA alloy. The sides of the triangle shown in FIG. 1 illustrate the generation of a ternary DA. Thus, as shown in FIG. 1 a quaternary alloy of AlGaInN may be obtained by a periodic structure of closely separated, thin binary layers of InN, GaN and AlN. A ternary DA of AlInN to be generated via a periodic structure of closely separated thin binary layers of AlN and InN. A ternary DA of InGaN may be generated via a periodic structure of close separated thin binary layers of InN and GaN. A ternary DA of AlGaN may be generated via a periodic structure of closely separated thin binary layers of AlN and GaN.

Figure 2A:
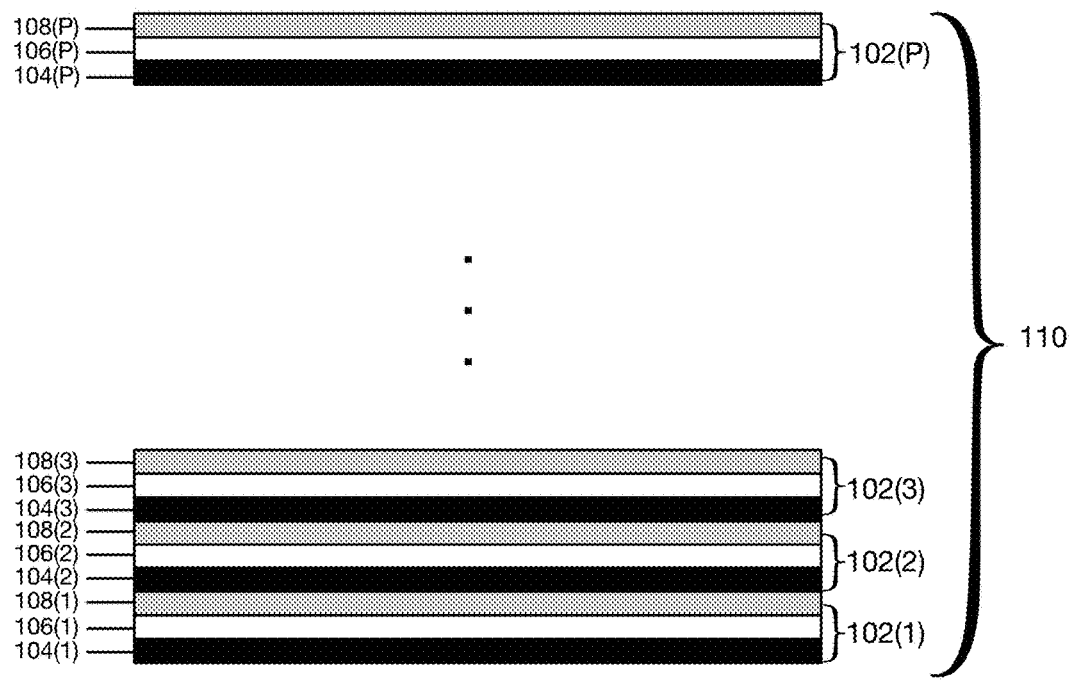
FIG. 2A is a schematic illustration of a quaternary III-Nitride digital alloy achieved by generating a periodic structure of closely separated binary alloy layers according to one embodiment.

By performing an alternate epitaxy of high quality ultra-thin III-Nitride binary alloys, the growth issues of conventional III-Nitride alloys are naturally avoided using the DA method described herein. In particular, FIG. 2A is a schematic illustration of a quaternary III-Nitride digital alloy achieved by generating a periodic structure of closely separated binary alloy layers according to one embodiment. As shown in FIG. 2A, a quaternary DA 110 is achieved by generating a periodic structure utilizing a periodic element 102, wherein periodic element 102 comprises a group of three different ultra-thin binary-alloy layers (104, 106 and 108), which are closely-separated from one another. According to one embodiment, the binary alloy layers comprising periodic element 102 may be AlN, GaN and InN. By combining all three ultra-thin binary-alloy layers (e.g. AlN, GaN, and InN) to form a short-period superlattice, an AlGaInN quaternary DA can be achieved. Thus, referring to FIG. 2A, a quaternary DA may be achieved via a periodic structure of P periods of periodic elements 102(1)-102(P), wherein each periodic element comprises three digital alloys (e.g., 104(1), 106(1) and 108(1)-104(P), 106(P) and 108(P).

Further, each of the binary alloys (e.g., AlN, GaN and InN) within a periodic element 102 is associated with a respective thickness represented in monolayer ("ML") units. Thus, referring again to FIG. 2A, the AlN binary layers may exhibit a thickness of L ML, the GaN digital alloy may exhibit a thickness of M ML and the AlN digital alloy may exhibit a thickness of N ML. By varying the respective thicknesses of the digital alloys (i.e., M, L and N) within a periodic element, the optoelectronic properties of the DA may be tuned.

Quaternary DA 110 is also associated with a total thickness T. According to one embodiment, the total thickness T must be finite and is determined in order to preserve a coherency of a wave function in quaternary DA 110.

Figure 2B:
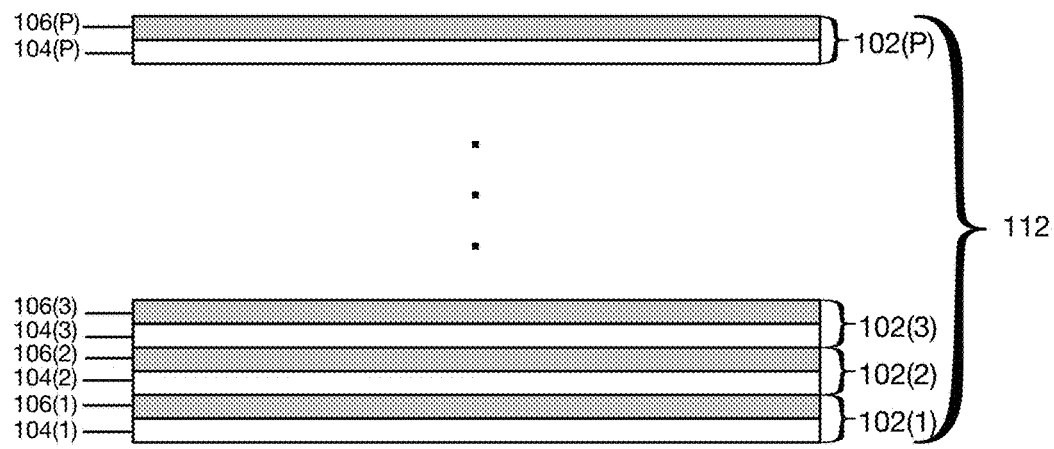
FIG. 2B is a schematic illustration of a ternary III-Nitride digital alloy achieved by generating a periodic structure of two different closely separated binary alloys according to one embodiment.

FIG. 2B is a schematic illustration of a ternary III-Nitride digital alloy achieved by generating a periodic structure of two different closely separated binary alloys according to one embodiment. According to one embodiment, the binary alloy layers may be two different alloys of AlN, GaN, and InN. In particular, FIG. 2B is a schematic illustration of a ternary III-Nitride digital alloy achieved by generating a periodic structure of closely separated binary alloy layers according to one embodiment. As shown in FIG. 2B, ternary DA 112 is achieved by generating a periodic structure utilizing a periodic element 102, wherein periodic element 102 comprises a group of two different ultra-thin binary-alloy layers (104, 106), which are closely-separated from one another. According to one embodiment, the binary alloy layers comprising periodic element 102 may be any two different ones from the group of AlN, GaN and InN. Thus, according to one embodiment, by combining two ultra-thin binary-alloy layers (e.g. two from the group of AlN, GaN, and InN) to form a short-period superlattice, either an AlGaN, AlInN or InGaN ternary DA 112 may be achieved. Thus, referring to FIG. 2B, a ternary DA may be achieved via a periodic structure of P periods of periodic elements 102(1)-102(P), wherein each periodic element comprises two digital alloys (e.g., 104(1), 106(1)-104(P), 106(P)).

Further, each of the binary alloys (e.g., AlN, GaN and InN) within a periodic element 102 is associated with a respective thickness represented in monolayer units. Thus, referring again to FIG. 2B, the AlN binary layers may exhibit a thickness of L monolayers, the GaN digital alloy may exhibit a thickness of M ML and the AlN digital alloy may exhibit a thickness of N ML. By varying the respective thicknesses of the digital alloys within a periodic element (i.e., M and L), the optoelectronic properties of the DA may be tuned.

Ternary DA 112 is also associated with a total thickness T. The total thickness T must be finite and is determined according to one embodiment in order to preserve a coherency of the wave function in the structure.

Figure 3:
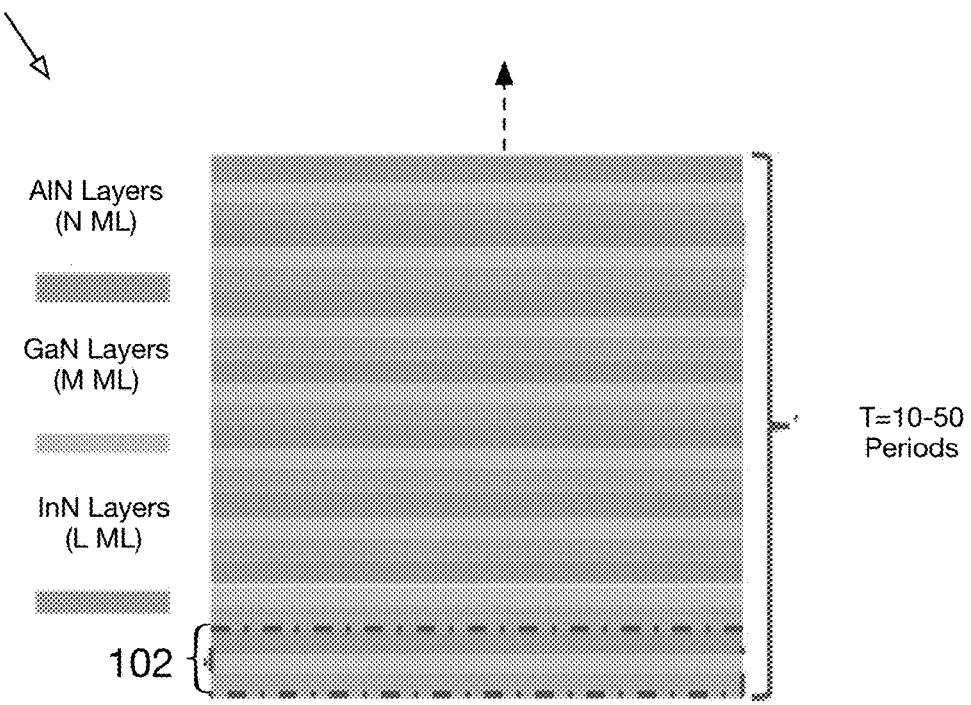
FIG. 3 illustrates one particular embodiment of a quaternary AlGaInN DA according to one embodiment.

FIG. 3 illustrates one particular embodiment of a quaternary AlGaInN DA according to one embodiment. Referring to FIG. 3 AlGaInN DA 302 comprises a periodic structure of periodic elements, wherein each periodic element comprises three binary digital alloys of AlN, GaN and InN. As shown in FIG. 3, AlGaInN DA 302 is achieved by generating a periodic structure utilizing a plurality of periodic elements 102 (only one specific periodic element 102 is called out in FIG. 3), wherein periodic element 102 comprises a group of three different ultra-thin binary-alloy layers of AlN, GaN, and InN, which are closely-separated from one another.

As shown in FIG. 3, each periodic element, 102, comprises L ML layers of InN, M ML of GaN and N ML of AlN. According to one embodiment, the thicknesses of each layer of InN, GaN and AlN in ML may be varied to tune the optoelectric properties of quaternary DA 302. That is, the variables L, M, N representing the number of ML of InN, GaN and AlN may be varied to tune the optoelectrical properties of AlGaInN DA 302.

Figure 4A:
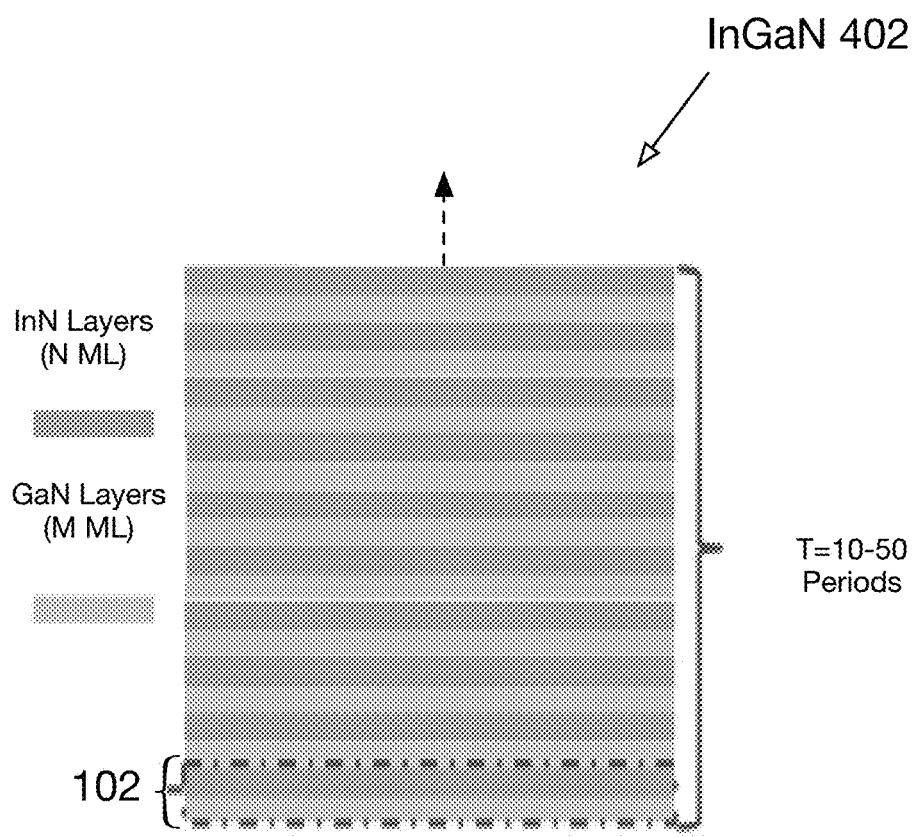
FIG. 4A illustrates a particular embodiments of a ternary DA of InGaN according to one embodiment.
Figure 4B:
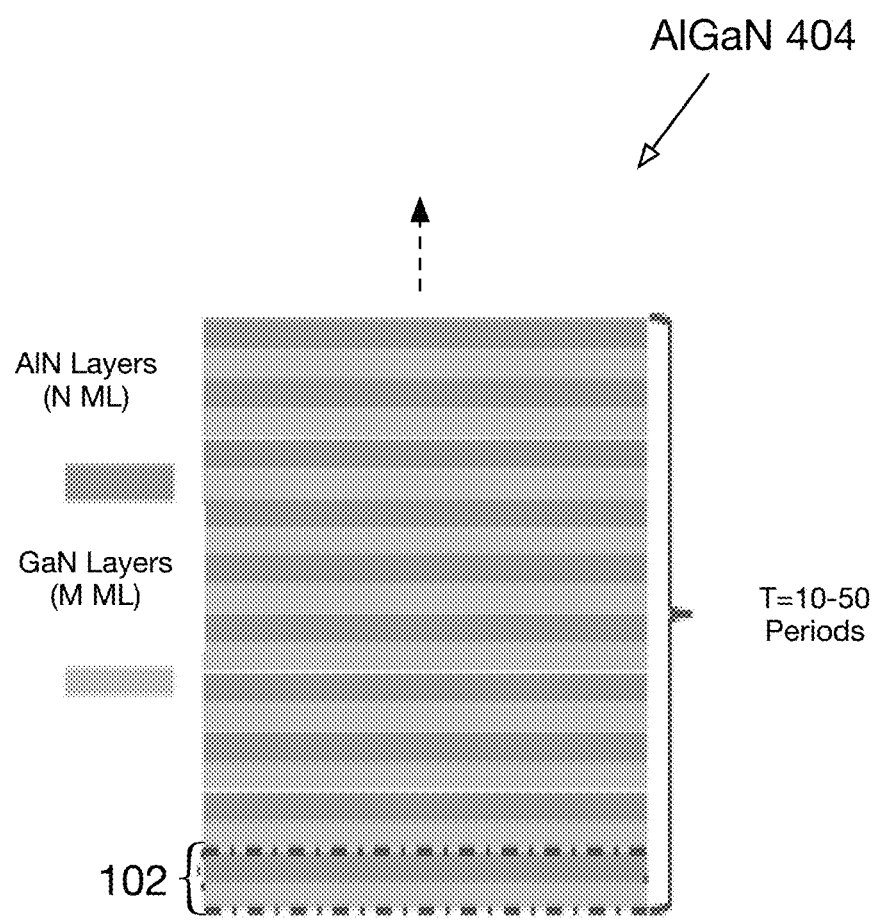
FIG. 4B illustrates a particular embodiments of a ternary DA of AlGaN according to one embodiment.
Figure 4C:
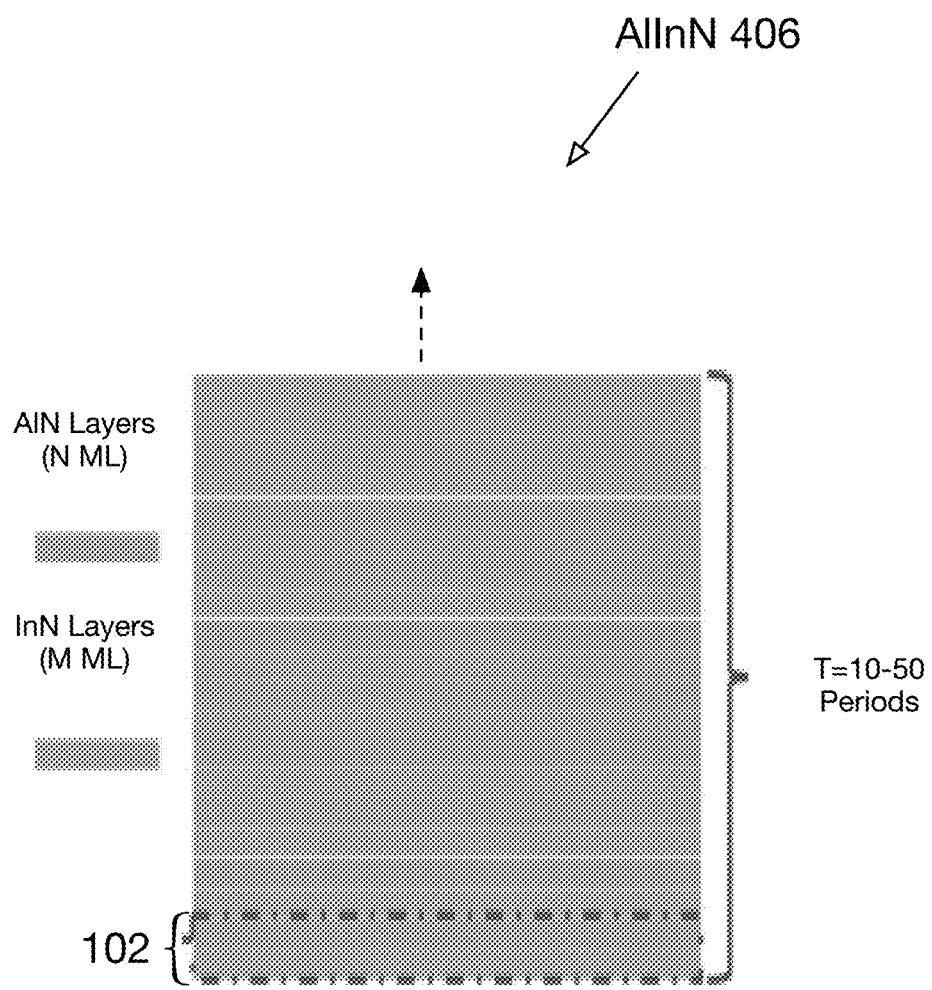
FIG. 4C illustrates a particular embodiments of a ternary DA of AlInN according to one embodiment.

FIGS. 4A-4C illustrate particular embodiments of ternary DAs of AlGaN, InGaN and AlInN respectively according to one embodiment. Referring to FIG. 4A InGaN DA 402 comprises a periodic structure of periodic elements, wherein each periodic element comprises two binary alloys of InN and GaN. InGaN DA 402 is achieved by generating a periodic structure utilizing a plurality of periodic elements 102 (only one specific periodic element 102 is called out in FIG. 4A), wherein periodic element 102 comprises a group of two ultra-thin binary-alloy layers of GaN, and InN, which are closely-separated from one another.

As shown in FIG. 4A, each periodic element, 102, comprises M ML layers of GaN and and N ML of InN. According to one embodiment, the thicknesses of each layer of GaN and InN in ML may be varied to tune the optoelectric properties of ternary DA 402. That is, the variables M and N representing the number of ML of GaN and InN may be varied to tune the optoelectrical properties of DA 402.

According to one embodiment, M and N are varied between 1-4 ML. Further, a total thickness T of 10-50 periods is used.

Referring to FIG. 4B AlGaN DA 404 comprises a periodic structure of periodic elements, wherein each periodic element comprises two binary alloys of AlN and GaN. AlGaN DA 404 is achieved by generating a periodic structure utilizing a plurality of periodic elements 102 (only one specific periodic element 102 is called out in FIG. 4B), wherein periodic element 102 comprises a group of two ultra-thin binary-alloy layers of AlN, and GaN, which are closely-separated from one another.

As shown in FIG. 4B, each periodic element, 102, comprises M ML layers of GaN and and N ML of AlN. According to one embodiment, the thicknesses of each layer of GaN and AlN in ML may be varied to tune the optoelectric properties of ternary DA 404. That is, the variables M and N representing the number of ML of GaN and AlN may be varied to tune the optoelectrical properties of AlGaN DA 404.

According to one embodiment, M and N are varied between 1-4 ML. Further, a total thickness T of 10-50 periods is used.

Referring to FIG. 4C AlInN DA 406 comprises a periodic structure of periodic elements, wherein each periodic element comprises two binary alloys of AlN and InN. AlInN DA 406 is achieved by generating a periodic structure utilizing a plurality of periodic elements 102 (only one specific periodic element 102 is called out in FIG. 4C), wherein periodic element 102 comprises a group of two ultra-thin binary-alloy layers of AlN, and InN, which are closely-separated from one another.

As shown in FIG. 4C, each periodic element, 102, comprises M ML layers of InN and and N ML of AlN. According to one embodiment, the thicknesses of each layer of InN and AlN in ML may be varied to tune the optoelectric properties of ternary DA 406. That is, the variables M and N representing the number of ML of InN and AlN may be varied to tune the optoelectrical properties of DA 406.

According to one embodiment, M and N are varied between 1-4 ML. Further, a total thickness T of 10-50 periods is used.

Figure 5A:
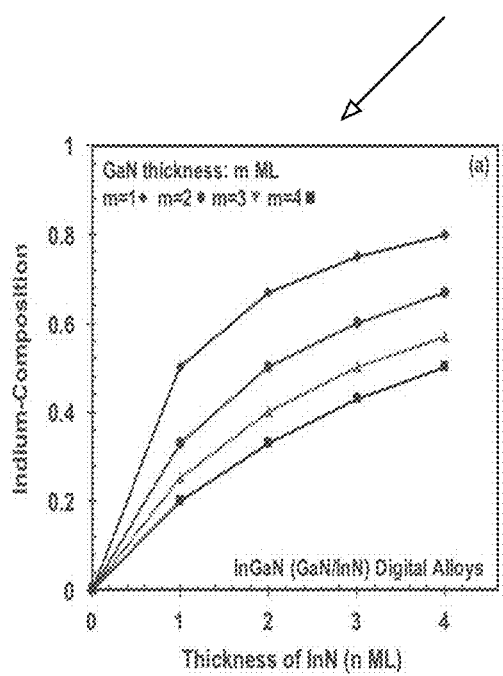
FIG. 5A is a plot illustrating Indium (In)-content in InGaN DA as a function of thickness of each binary alloy layer respectively according to one embodiment.
Figure 5B:
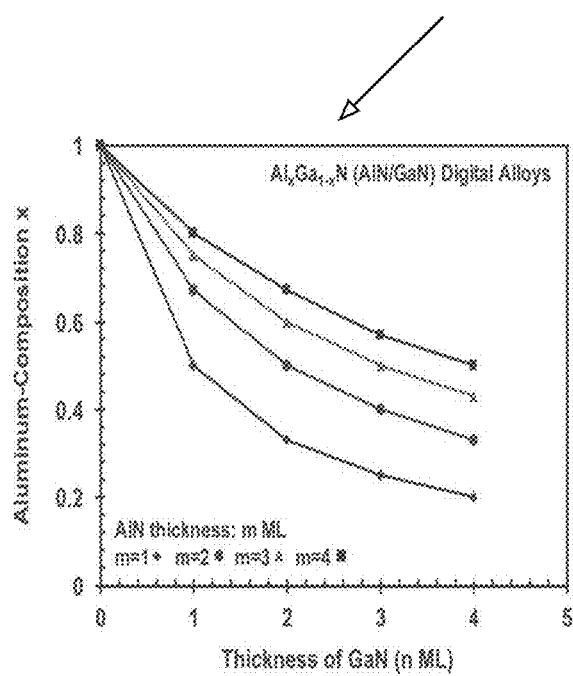
FIG. 5B is a plot illustrating Aluminum (Al)-content in AlGaN DA as a function of thickness of each binary alloy layer respectively according to one embodiment.

FIGS. 5A-5B illustrate Indium (In)-content in InGaN DA 402 and Aluminum (Al)-content in AlGaN DA 404 as a function of the thickness of each binary alloy layer respectively. According to one embodiment, the In-content x in the $In_xGa_{1-x}N$ DA (and the Al-content x in the $Al_xGa_{1-x}N$) is determined by the duty cycle $x=n/(m+n)$. Referring to FIGS. 5A-5B, the In-content and Al-content can both be tuned from 20% to 80% by varying the thickness of each layer from 1 to 4 MLs in InGaN DA 402 and AlGaN DA 404.

Figure 6A:
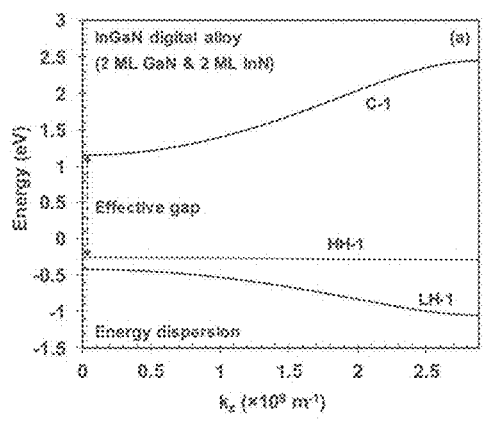
FIG. 6A is a plot illustrating calculated miniband structures of InGaN DA utilizing 2 ML GaN with 2 ML InN as one single period element according to one embodiment.
Figure 6B:
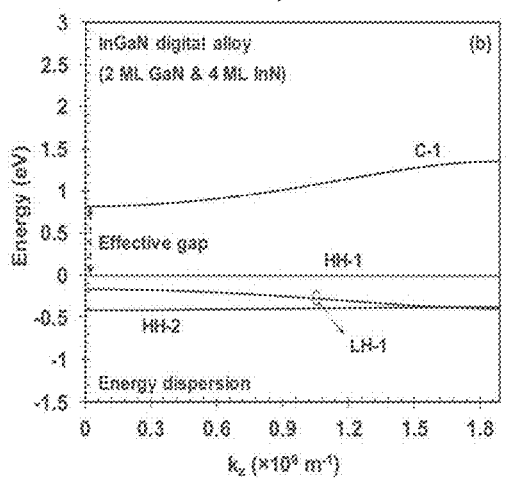
FIG. 6B is a plot illustrating calculated miniband structures of InGaN DA utilizing 2 ML GaN with 4 ML InN as one single period element according to one embodiment.

FIGS. 6A-6D illustrate calculated miniband structures of four exemplary InGaN DAs according to one embodiment. In particular, FIG. 6A shows an InGaN DA 402 utilizing 2 ML GaN with 2 ML InN as one single period element. FIG.

Figure 6C:
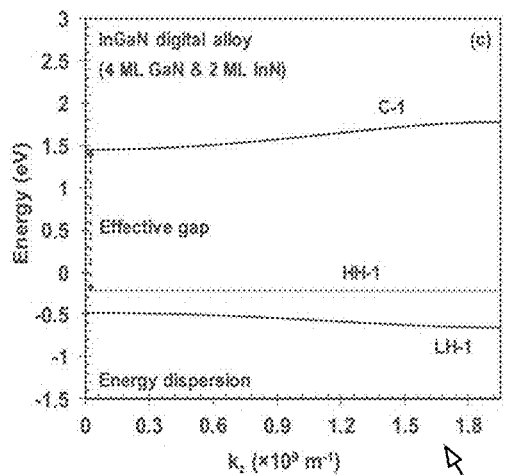
FIG. 6C is a plot illustrating calculated miniband structures of InGaN DA utilizing 4 ML GaN with 2 ML InN as one single period element according to one embodiment.
Figure 6D:
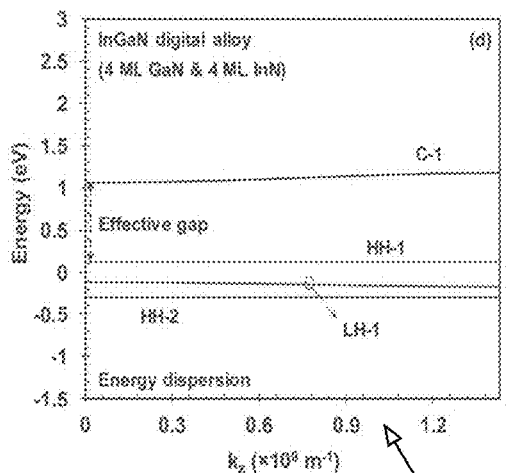
FIG. 6D is a plot illustrating calculated miniband structures of InGaN DA utilizing 4 ML GaN with 4 ML InN as one single period element according to one embodiment.

6B shows an InGaN DA 402 utilizing 2 ML GaN with 4 ML InN as one single period element. FIG. 6C shows an InGaN DA 402 utilizing 4 ML GaN with 2 ML InN as one single period element. FIG. 6D shows an InGaN DA 402 utilizing 4 ML GaN with 4 ML InN as one single period element.

FIGS. 6A-6D illustrate that the effective energy gap between the ground-state miniband in conduction band (C-1) and the ground-state miniband in valence band (HH-1) is reduced as the thickness of those InN binary layers increased. Further, as the thickness of the GaN and InN layers is reduced, the bandwidth of each miniband increases. These trends suggest that the energy gap as well as the optoelectronic properties of the DA can be engineered by simply tuning the thickness of each ultra-thin binary-alloy layer in the DAs.

Figure 7A:
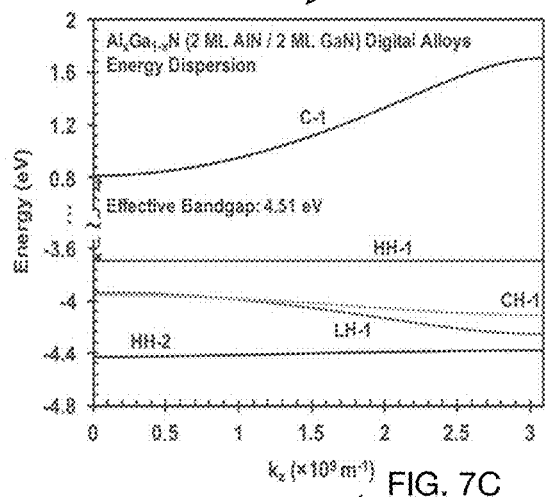
FIG. 7A is a plot illustrating calculated miniband structures of AlGaN DA utilizing 2 ML GaN with 2 ML AlN as one single period element according to one embodiment.
Figure 7B:
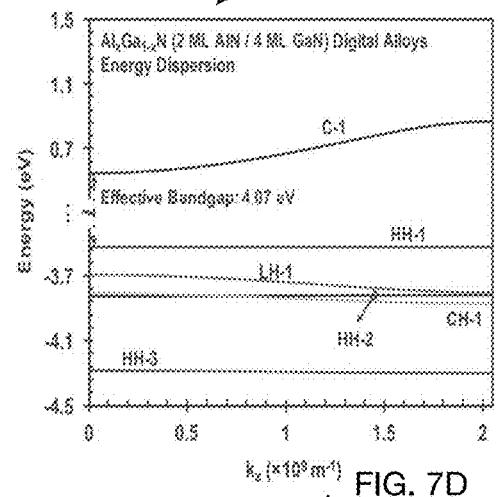
FIG. 7B is a plot illustrating calculated miniband structures of AlGaN DA utilizing 4 ML GaN with 2 ML AlN as one single period element according to one embodiment.
Figure 7C:
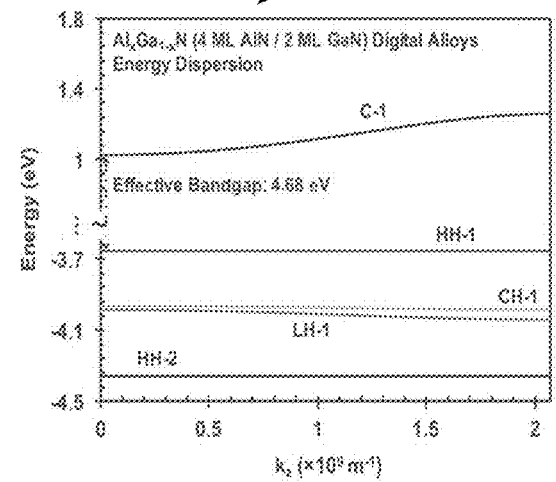
FIG. 7C is a plot illustrating calculated miniband structures of AlGaN DA utilizing 2 ML GaN with 4 ML AlN as one single period element according to one embodiment.
Figure 7D:
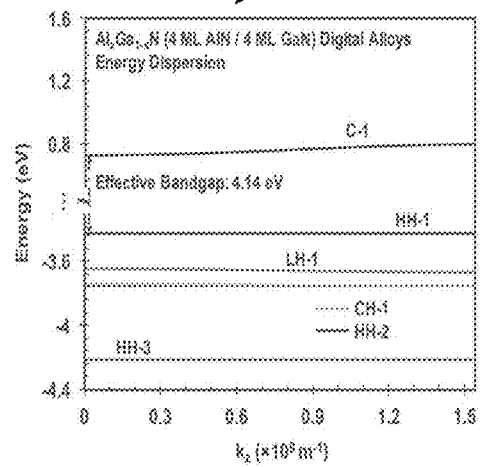
FIG. 7D is a plot illustrating calculated miniband structures of AlGaN DA utilizing 4 ML GaN with 4 ML AlN as one single period element according to one embodiment.

Similar phenomenon can be observed in the AlGaN DA as shown in FIGS. 7A-7D. In particular, FIGS. 7A-7D illustrate calculated miniband structures of four exemplary AlGaN DAs according to one embodiment. In particular, FIG. 7A shows an AlGaN DA 404 utilizing 2 ML GaN with 2 ML AN as one single period element. FIG. 7B shows an AlGaN DA 404 utilizing 2 ML AN with 4 ML GaN as one single period element. FIG. 7C shows an AlGaN DA 404 utilizing 4 ML AN with 2 ML GaN as one single period element. FIG. 7D shows an AlGaN DA 404 utilizing 4 ML GaN with 4 ML AN as one single period element.

FIG. 8A shows tunable energy gaps of InGaN DAs formed by M ML GaN and N ML InN ultra-thin binary-alloy layers according to one embodiment. In particular, according to one embodiment, the effective energy gap of InGaN DAs 402 can be engineered from 0.63 eV (with 1 ML GaN and 4 MLs InN) to 2.4 eV (with 4 MLs GaN and 1 ML InN). Correspondingly, according to one embodiment, a transition wavelength of InGaN DA 402 varied between ~510 nm to ~1900 nm covering the green up to infrared regime.

FIG. 8B shows tunable energy gaps of AlGaN DAs formed by M ML AN and N ML GaN ultra-thin binary-alloy layers according to one embodiment. As shown in FIG. 8B, the tunable energy gap be engineered from 3.96 eV (with 1 ML AlN and 4 MLs GaN) to 5.20 eV (with 4 MLs AlN and 1 ML GaN). The corresponding transition wavelength of AlGaN DA 404 according to this embodiment ranged from ~240 nm to ~310 nm covering the deep-UV regime. The broad tunability of energy gaps covered by InGaN DAs and AlGaN DAs implies great potential of such III-Nitride DAs as nano-engineered active regions for optoelectronics applications.

Figure 9A:
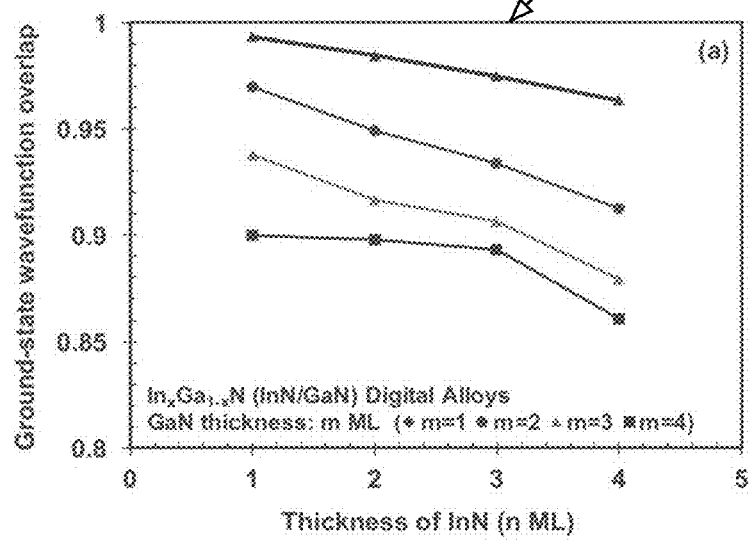
FIG. 9A show calculated wave functions overlap of ground-state electron and heavy hole as a function of the thickness of each binary-alloy layer for InGaN DA.

FIG. 9A show calculated wave function overlap of ground-state electron and heavy hole as a function of the thickness of each binary-alloy layer for InGaN DA. As shown in FIG. 9A, the ground state carrier wavefunction overlap in InGaN DA is varied from 86% to 99% while the thickness of the GaN and InN binary-alloy layer changes from 1 to 4 MLs.

Figure 9B:
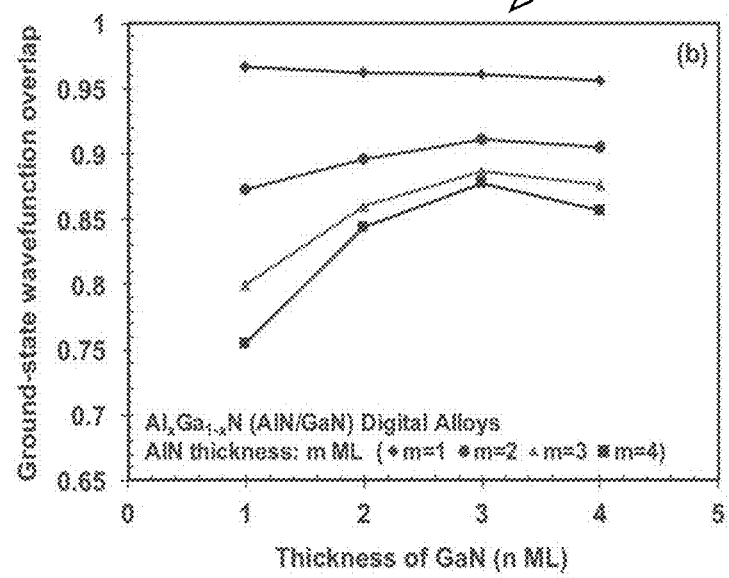
FIG. 9B show calculated wave functions overlap of ground-state electron and heavy hole as a function of the thickness of each binary-alloy layer for AlGaN DA.

FIG. 9B show calculated wave function overlap of ground-state electron and heavy hole as a function of the thickness of each binary-alloy layer for AlGaN DA. As shown in FIG. 9B, the ground-state carrier wavefunction overlap in the AlGaN DA ranges from 75% to 97% while the thickness of the AlN and GaN binary-alloy layer changes from 1 to 4 MLs.

As shown in FIGS. 9A-9B, for InGaN and AlGaN, the polarization induced charge separation issue is effectively suppressed within the III-Nitride DA structures by employing ultra-thin binary-alloy layers. Eventually, the entire III-Nitride DA performs as a complete "active alloy" that exhibits comparable characteristics of a conventional alloy. The large overlaps observed in these DAs provide a strong suggestion that these nano-structures behave as an effective "alloy".

By employing a AlGaN DA structure, the valence band cross over issue in the conventional AlGaN ternary alloy with high Al-content can be solved. The valence band cross over issue is attributed to relocation of the crystal-field spilt-off hole (CH) band sufficiently higher than the heavy hole (HH) band. Thus the dominant transition in the conventional AlGaN active region will switch from C-HH to C-CH leading to a dominant TM-polarized emission. Such dominant TM-polarized emission is not preferable in the top emitter application due to its low extraction efficiency.

Figure 10:
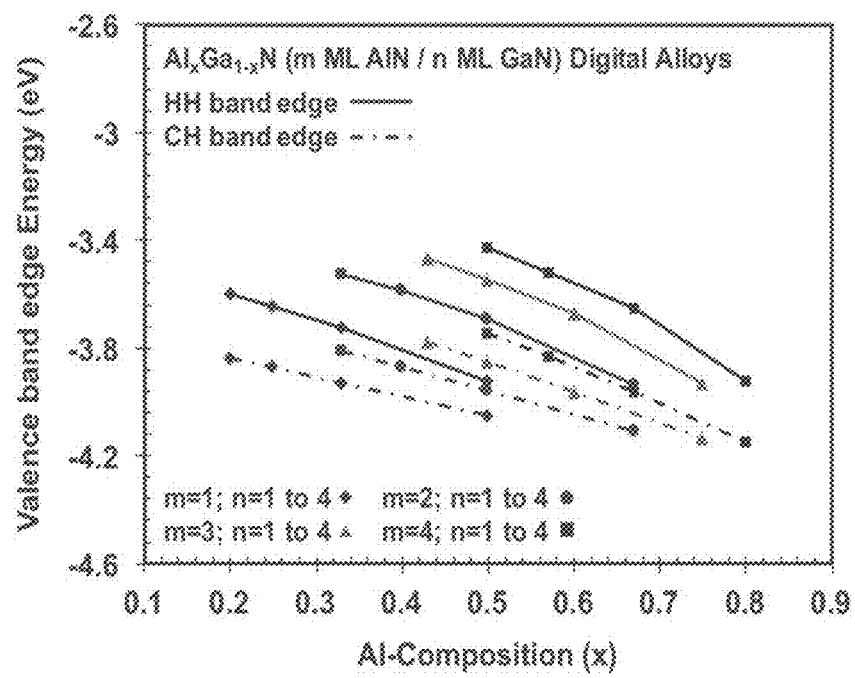
FIG. 10 illustrates the calculated band edge energy position of the valence sub-bands (HH and CH bands) in AlGaN DA as a function of the thickness of each ultra-thin binary alloy layer.

FIG. 10 illustrates the calculated band edge energy position of the valence sub-bands (HH and CH bands) in AlGaN DA as a function of the thickness of each ultra-thin binary alloy layer. Referring to FIG. 10, it is clear to see that the HH band is always located sufficiently high above the CH band due to the valence band rearrangement. Such phenomenon indicates that the dominant transition in the AlGaN DA can be always the C-HH transition leading to the dominant TE-polarized emission with high efficiency for the top emitter application.

These and other advantages maybe realized in accordance with the specific embodiments described as well as other variations. It is to be understood that the above description is intended to be illustrative, and not restrictive. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" are used as the plain-English equivalents of the respective terms "comprising" and "wherein." Moreover, in the following claims, the terms "first," "second," and "third," etc. are used merely as labels, and are not intended to impose numerical requirements on their objects.

What is claimed is:

1. A method of forming a III-Nitride quaternary digital alloy ("DA") of AlGaInN, said method comprising:
    generating a periodic structure of closely separated binary alloy layers that collectively form a single-crystal material structure by an epitaxial process selected from a group consisting of metalorganic chemical vapor deposition (MOCVD) and molecular beam epitaxy (MBE), each of said binary alloy layers comprising one of AlN, GaN and InN, wherein each of said binary alloy layers has a respective thickness of 1-4 monolayers ("ML"s), wherein a first binary alloy layer of said binary alloy layers and a second binary alloy layer of said binary alloy layers provide a ground-state wave function overlap of at least 75%, and wherein said periodic structure of binary alloy layers has a total thickness of between 10-50 periods.

2. The method according to claim 1, wherein a first period of said periodic structure comprises 3 binary alloy layers.

3. The method according to claim 1, wherein said periodic structure of binary alloy layers forms a superlattice structure.

4. The method according to claim 3, wherein said superlattice structure comprises a strong inter-well resonant coupling between said binary alloy layers.

5. The method according to claim 1, wherein said periodic structure of closely separated binary alloy layers is generated using an epitaxial process.

6. The method according to claim 1, wherein an energy gap of said AlGaInN DA may be tuned by varying said respective thickness of each of said binary alloy layers.

7. The method according to claim 1, wherein said ground-state wave function overlap is at least 85%.

8. The method of claim 1, wherein said respective thickness is 1-2 MLs.

9. The method of claim 1, wherein said periodic structure has an energy gap of at least 0.60 eV.

10. The method of claim 1, wherein said periodic structure has an energy gap of at least 3.90 eV.

11. A III-Nitride quaternary digital alloy ("DA") of AlGaInN comprising:
a single-crystal periodic structure of closely separated binary alloy layers, each of said binary alloy layers comprising one of AlN, GaN and InN, wherein each of said binary alloy layers has a respective thickness of 1-4 MLs, wherein a first binary alloy layer of said binary alloy layers and a second binary alloy layer of said binary alloy layers provide a ground-state wave function overlap of at least 75% and, wherein said periodic structure of binary alloy layers has a total thickness of between 10-50 periods.

12. The III-Nitride quaternary DA according to claim 11, wherein a first period of said periodic structure comprises 3 binary alloy layers.

13. The III-Nitride quaternary DA according to claim 11, wherein said periodic structure of binary alloy layers forms a superlattice structure.

14. The III-Nitride quaternary DA according to claim 13, wherein said superlattice structure comprises strong inter-well resonant coupling between binary alloy layers.

15. The III-Nitride quaternary DA according to claim 11, wherein said periodic structure of closely separated binary alloy layers is generated using an epitaxial process.

16. The III-Nitride quaternary DA according to claim 11, wherein an energy gap of said AlGaInN DA may be tuned by varying said respective thickness of each of said binary alloy layers.

17. The III-Nitride quaternary DA of claim 11, wherein said respective thickness is 1-2 MLs.

18. The III-Nitride quaternary DA of claim 11, wherein said ground-state wave function overlap is at least 85%.

19. The III-Nitride quaternary DA of claim 11, wherein said periodic structure has an energy gap of at least 0.60 eV.

20. The III-Nitride quaternary DA of claim 11, wherein said periodic structure has an energy gap of at least 3.90 eV.

21. A method of forming a III-Nitride quaternary digital alloy ("DA") of AlGaInN, said method comprising:
generating, using a single-crystal epitaxial process selected from a group consisting of metalorganic chemical vapor deposition (MOCVD) and molecular beam epitaxy (MBE), a periodic structure of closely separated binary alloy layers, each of said binary alloy layers comprising one of AlN, GaN and InN, wherein each of said binary alloy layers has a respective thickness of 1-4 monolayers ("ML"s), wherein a first binary alloy layer of said binary alloy layers and a second binary alloy layer of said binary alloy layers provide a ground-state wave function overlap of at least 75%, and wherein said periodic structure of binary alloy layers has a total thickness of between 10-50 periods.

* * * * *